United States Patent [19]

Suzuki et al.

[11] Patent Number: 4,707,724
[45] Date of Patent: Nov. 17, 1987

[54] SEMICONDUCTOR DEVICE AND METHOD OF MANUFACTURING THEREOF

[75] Inventors: Akira Suzuki, Ohme; Hideki Tanaka, Koganei; Gen Murakami, Machida, all of Japan

[73] Assignee: Hitachi, Ltd., Tokyo, Japan

[21] Appl. No.: 175

[22] Filed: Jan. 2, 1987

Related U.S. Application Data

[63] Continuation of Ser. No. 740,420, Jun. 3, 1985, abandoned.

[30] Foreign Application Priority Data

Jun. 4, 1984 [JP] Japan ............................ 59-112933

[51] Int. Cl.$^4$ ............................................ H01L 23/48
[52] U.S. Cl. ............................ 357/71; 357/70; 357/72; 437/211
[58] Field of Search ............ 357/65, 67, 70, 71, 357/72; 174/52 PE; 427/88, 89, 92; 29/588, 589, 590, 831

[56] References Cited

U.S. PATENT DOCUMENTS 4,441,118  4/1984  Fister et al. .................. 357/67 R X

FOREIGN PATENT DOCUMENTS 52-2170    1/1977   Japan ............................ 357/72
54-81777   6/1979   Japan .
54-129976  10/1979  Japan .
55-67155   5/1980   Japan ............................ 357/71 R
58-16044   1/1983   Japan .
58-175852  10/1983  Japan ............................ 357/72
58-53700   11/1983  Japan .
59-58833   4/1984   Japan ............................ 357/67

Primary Examiner—Martin H. Edlow
Assistant Examiner—Sara W. Crane
Attorney, Agent, or Firm—Antonelli, Terry & Wands

[57] ABSTRACT

A nickel-alloy layer is formed on a lead frame made of a material which consists chiefly of copper as a base material, a pellet is then mounted, and a resin is applied thereto to form a package. Then, a copper layer or an alloy layer of copper and 0.05 to 0.2% by weight of zinc is formed on said nickel-containing alloy layer of the external lead portions. A solder layer is then formed on the copper layer or on the zinc-copper alloy layer that is formed on the external lead portions. With the thus formed semiconductor device, the resin exhibits increased adhesiveness relative to the tab and lead frame in the package. Therefore, peeling is prevented from occurring on the interface between the resin and the tab or lead frame. Further, no brittle intermetallic compound is formed by the heating in the metal layer such as the solder layer on the external lead portions. Accordingly, the metal layer is effectively prevented from peeling off.

15 Claims, 4 Drawing Figures

SEMICONDUCTOR DEVICE AND METHOD OF MANUFACTURING THEREOF

This is a continuation of application Ser. No. 740,420, filed June 3, 1985, now abandoned.

BACKGROUND OF THE INVENTION

The present invention relates to a semiconductor device and to a method of manufacture thereof. Particularly, the invention relates to a semiconductor device of the type sealed with resin and an art that can be effectively adapted to a method of manufacture thereof.

A semiconductor device of the type sealed with resin is usually obtained by bonding a pellet onto a tab that serves as a pellet-mounting portion in a lead frame, by electrically connecting the pellet to inner ends of the leads by wire bonding, and by molding an epoxy resin or the like thereon.

In order to decrease thermal resistance of semiconductor devices and to increase their resistance to humidity, it is accepted practice to fabricate a base member of lead frame using copper, which has good thermal conductivity and a coefficient of thermal expansion which is close to that of the sealing resin, and to fabricate the lead frame using a copper alloy which is chiefly composed of copper.

With the lead frame made of copper alloy, however, the surface is easily oxidized by heating while assembling the device. The film of copper oxide is easily peeled off from the surface of base member composed of copper alloy. When the resin sealed-type semiconductor device employing such a lead frame is to be sealed by the molding of resin, therefore, the sealing resin tends to peel off from the surface of the lead frame due to poor adhesiveness between the copper alloy base member and the sealing resin. Therefore, moisture and contaminating substance infiltrate into the package through poorly adhered portions or peeled portions; i.e., the semiconductor device loses its resistance to humidity. In other words, the copper alloy forming the lead frame is easily oxidized by heat in the assembling step, and the film of copper oxide having poor adhesiveness easily peels off from the base member composed of copper. Therefore, a gap develops on the interface between the sealing resin and the lead frame which permits water and other contaminants to enter. Accordingly, the semiconductor device of such a structure has poor resistance to humidity and is therefore unreliable.

In order to improve adhesiveness between the lead frame and the sealing resin, therefore, it has been attempted to prevent the oxidation from taking place on the surface of the copper base member of the lead frame by plating a tin-nickel alloy or an iron-nickel alloy on the whole surface of the lead frame. These alloys exhibit sufficiently great adhesive strength relative to the resin even when their surfaces are oxidized in the heating step.

The above-mentioned example in which a tin-nickel alloy is plated onto the lead frame that employs copper as a base material, has been disclosed, for example, in Japanese Patent Laid-Open Nos. 81777/1979 and 129976/1979.

SUMMARY OF THE INVENTION

In a resin sealed-type semiconductor device, on the other hand, it can be contrived to apply solder or the like to external leads that stretch outwardly from side surfaces of the package in order to improve adhesiveness when it is to be mounted on a printed wiring board. In the case of a semiconductor device employing lead frame in which the surface of copper base member is coated with a tin-nickel alloy layer or the like, however, there is formed an intermetallic compound (such as $Cu_3Sn$, $Cu_6Sn_5$ or the like) from the surface of the copper base metal of the lead frame to the interior of the solder layer in the step of plating solder onto the alloy layer and in the step of effecting heat-treatment at about 150° C. The intermetallic compound is very brittle, and the applied metal layer such as a solder layer is peeled off from the copper alloy base member of the lead frame presenting problems with regard to resistance to moisture and resistance to heat.

It is not yet clear by what mechanism the intermetallic compound is formed between copper which constitutes base member of the lead frame and the solder layer. Based on intensive study, the inventors consider that the intermetallic compound is formed by the mechanism that is described below.

Namely, a $Cu_6Sn_5$ ($\eta$ phase) is first formed on the interface between cooper constituting the base member of lead frame and the solder due to diffusion of tin from the solder into copper. As heating proceeds, furthermore, the $Cu_6Sn_5$ is formed in increased amounts and an intermetallic compound $Cu_3Sn$ ($\epsilon$ phase) is formed in the form of a thin layer on the interface between $Cu_6Sn_5$ and the base member of copper to make soldering difficult. As the heating is effected at a further elevated temperature or for an extended period of time, the compound $Cu_3Sn$ is formed in increased amounts and there are further formed $Cu_{31}Sn_8$ and other intermetallic compounds that are not known but that are very brittle so as to deprive the device of mechanical strength against vibration or wear and to increase electric resistance. In this case, the metallic luster is lost, and the appearance becomes turbid white. Further, the surface loses its smoothness and becomes rough. Depending upon the combination of materials, furthermore, the intermetallic compound is readily formed on the interface even at room temperature making soldering difficult or even impossible.

The inventors have further discovered that the formation of this intermetallic compound gives rise to the occurrence of defects such as cracks and voids in the interface between the base member of lead frame and the solder layer.

The object of the present invention therefore is to provide a semiconductor device which is free from the above-mentioned problems or defects, which has excellent characteristics in regard to resistance against humidity and resistance against heat, and which is highly reliable.

Another object of the present invention is to provide a method of manufacturing semiconductor devices, that makes it possible to obtain highly reliable semiconductor devices through a simple and easy processing.

The above and other objects as well as novel features of the invention will become obvious from the description of the specification and the accompanying drawings.

A representative example of the invention disclosed in the specification is briefly described below.

That is, a nickel-alloy layer is formed on the lead frame made of a material which consists chiefly of copper as a base material, a pellet is then mounted, and a resin is applied thereto to form a package. Then, copper or an alloy of copper and 0.05 to 0.2% by weight of zinc is applied onto the nickel-containing alloy layer of the external lead portions. A solder layer is then formed on the copper layer or on the zinc-copper alloy layer that is formed on the external lead portions.

With the thus formed semiconductor device, the resin exhibits increased adhesiveness relative to the tab and lead frame in the package. Therefore, peeling is prevented from occurring on the interface between the resin and the tab or lead frame. Further, no brittle intermetallic compound is formed by the heating in the metal layer such as the solder layer on the external lead portions. Accordingly, the metal layer is effectively prevented from peeling off.

The intermetallic compound is formed in a small amount by heating in the metal layer on the external lead portions even when the copper layer or the alloy layer of copper containing a small amount of zinc is present between the nickel alloy layer and the solder layer. Compared with when no copper is present, however, the intermetallic compound is formed in relatively small amounts, and decrease in the adhesiveness can be virtually neglected between the copper base member of the lead frame and the solder layer that is applied thereon. Thus, the object of the invention is accomplished. This fact was found through intensive study conducted by the inventors of the present invention.

Copper is the copper layer (inclusive of copper in the alloy layer consisting chiefly of copper) stands for pure copper. This term, however, is not meant to exclude copper in which impurities are inevitably contained in the step of plating or in the like step.

DESCRIPTION OF THE PREFERRED EMBODIMENTS

Figure 1:
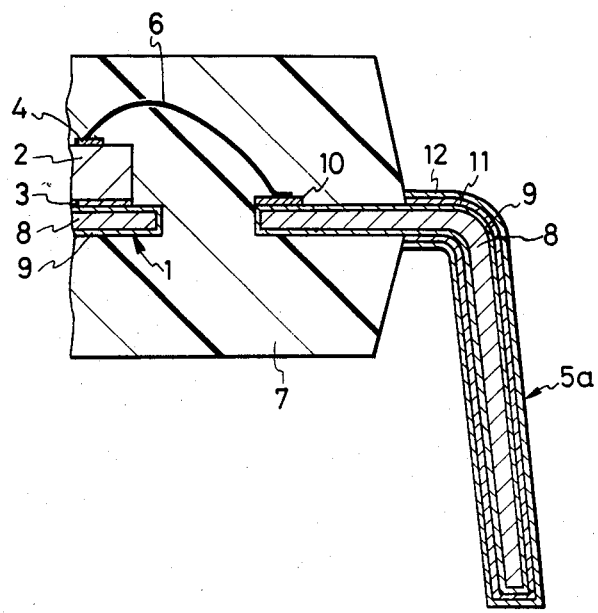
FIG. 1 is a section view which shows, on an enlarged scale, a portion of a semiconductor device according to an embodiment of the present invention.
Figure 2:
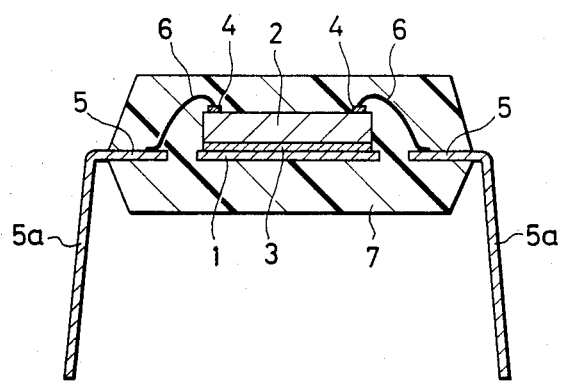
FIG. 2 is a section view of the semiconductor device of the embodiment of the present invention.

Embodiment 1:

FIG. 1 is a section view showing, on an enlarged scale, a portion of a resin sealed-type semiconductor device according to an embodiment 1 of the present invention, which corresponds to the right half portion of the semiconductor device shown in FIG. 2.

In the semiconductor device of the embodiment 1, as shown in FIG. 2, a pellet 2 in which are formed semiconductor elements such as transistors or LSI, is mounted on a tab 1 which is a portion of the lead frame using an electrically conductive adhesive agent 3 such as an epoxy resin containing silver. Bonding pads 4 of the pellet 2 are electrically connected to the inner ends of leads 5 via bonding wires 6, and a resin 7 such as epoxy resin is applied thereto to form a package. Surfaces of external leads 5a are treated before or after they are folded.

According to the semiconductor device of the embodiment 1 shown in FIG. 1, a base member 8 of lead 5 and of tab 1 is made of an alloy which consists chiefly of copper, and the surface of the base member 8 is coated with a first layer 9 which consists of a tin-nickel alloy (Sn/Ni≈7/3) to a thickness of 0.2 μm by the plating method. Through experiments, the inventors have determined optimum composition and thickness of the Sn-Ni alloy layer.

The base member of lead frame used for the semiconductor device of embodiment 1 has a chemical composition consisting of (all per cent by weight) smaller than 0.10 of iron, 1.7 to 2.3 of tin, 0.1 to 0.4 of nickel, less than 0.15 of phosphorous, less than 0.20 of zinc, and less than 0.05 of lead, the balance being copper, and wherein Cu+Sn+Ni+P≧99.7. The composition also contains impurities that are inevitably introduced during the manufacturing steps.

Depending upon the kind of copper alloy constituting the lead frame, as well as the content and distribution of copper therein, there develops a great difference in the formation of the brittle intermetallic compound that is caused by the diffusion of tin in the solder layer into the copper base member when left to stand at high temperatures and in the peeling of the solder layer when the lead frame is bent. Through the experiments, the inventors have discovered that the lead frame should not be made of a material which consists of copper and large parts of iron (larger than about 0.7% by weight), or a copper alloy material in which elements diffuse poorly.

According to the lead frame of the above-mentioned composition used for the semiconductor device of the embodiment 1, the kind of copper alloy material forming the base member and the ratios of contents are so selected as to satisfy characteristics (thermal resistance, mechanical strength, stability of added elements) required for the lead frame, and to form intermetallic compounds in small amounts, that is caused by the diffusion of tin in the solder and copper in the base member.

The above-mentioned lead frame can be preferably adapted to the semiconductor device of the present invention. The lead frame, however, should in no way be limited thereto only. For instance, the lead frame disclosed in Japanese Patent Publication No. 53700/1983 or Japanese Patent Laid-Open No. 16044/1983 may be employed. The base members of the lead frame disclosed in these publications are made of a copper alloy consisting of 0.8 to 2.5% by weight of tin, 0.01 to 0.4% by weight of phosphorus, and the balance being copper and impurities that are inevitably introduced, and the amount of oxygen among the impurities being smaller than 0.0020% by weight, or a copper alloy consisting of 0.8 to 2.5% by weight of tin, 0.01 to 0.45% by weight of phosphorous, 0.05 to 0.3% by weight of nickel, and the balance being copper and impurities that are inevitably introduced, and the amount of oxygen amount the impurities being smaller than 0.0020% by weight, or a copper alloy consisting of 1.7 to 2.5% by weight of tin, 0.03 to 0.35% by weight of phosphorus, 0.1 to 0.6% by weight of nickel, and the balance being copper and impurities that are inevitably introduced.

According to another embodiment, the first layer 9 will be composed of an iron-nickel alloy layer. From the standpoint of adhesiveness between the sealing resin and the lead frame, it has been confirmed that a Fe-Ni alloy layer having a composition of Fe/Ni≈5/5 and a thickness of 0.5 μm gives good results, since it does not lose its adhesive strength even after heat-treating.

Further, a silver layer 10 is formed on the first layer 9 on the wire bonding portion at the upper end of the lead frame 5 by the partial plating method. Moreover, a second layer 11 composed of copper and having a thickness of about 5.5 μm is formed on the first layer 9 on the external lead 5a, and a third layer 12 composed of solder having a composition Pb/Sn=1/9 and a thickness of 7.4 to 9.2 μm is formed thereon by the plating method.

According to the above-mentioned semiconductor device, peeling on the interface between the resin 7 and the lead 5 or tab 1 in the package is prevented. Therefore, the package exhibits increased resistance to humidity.

According to the semiconductor device of the embodiment 1, the tin-nickel alloy layer is plated onto the lead frame of copper alloy in advance. Then, after having effected ordinary assembly and molding, a copper layer is formed on the external leads and a solder layer is further formed thereon by ordinary plating.

Thus, the semiconductor device of the present invention is formed through a simple and easy process.

According to the semiconductor device of the present invention having a tin-nickel alloy layer formed on the surface of the tab 1 or the lead 5 as described above, there is formed a stable oxide film when the surface of the alloy is oxidized in the step of heating. Therefore, the resin of the package exhibits strong adhesiveness relative to the lead frame. Moreover, the brittle intermetallic compound is not formed even on the external leads 5a. Therefore, the coated layer does not crack, and the resin does not peel. That is, according to the present invention, a copper layer is formed to a thickness of 5.5 μm under the solder layer. Owing to the presence of the copper layer, relatively little intermetallic compound is formed, and the solder layer is effectively prevented from peeling when the lead frame is bent.

It has been clarified through experiments by the inventors that the copper layer under the solder layer helps reduce the formation of intermetallic compounds and is also effective in preventing the solder layer from peeling when the lead frame is bent.

However, the reason for this has not yet been clarified; hence, it is difficult to present a unified theory that can be easily grasped by disinterested observers.

The reasons which the inventors consider are as described below. That is, intermetallic compounds are formed between copper in the copper alloy that constitutes the base member of lead frame and the solder layer, since elements such as iron, tin nickel, phosphorous and lead contained in trace amounts in the copper alloy, work to promote the formation of intermetallic compounds. This can be implied from the fact that the intermetallic compounds are formed conspicuously and the solder layer is peeled off remarkably when the lead frame is folded, when use is made of a copper alloy which contains iron in large amounts (greater than about 0.7%), a copper alloy in which elements disperse poorly, or an unstable copper alloy in which iron, nickel and the like segregate on the interface between the copper base member and the solder layer when the device is left to stand at a high temperature after the treatment of soldering.

According to the present invention, on the other hand, the copper layer underlying the solder layer is formed by the plating, and is composed of pure copper. Impurities may be inevitably introduced into the pure copper during the manufacturing step such as plating step. The copper layer, however, does not contain elements (such as Fe, Sn, Ni, Pb, P, etc.) in amounts as much as those that are contained in the base material of lead frame. Therefore, the intermetallic compound is formed very little by the reaction of copper contained in the copper layer under the solder layer with tin contained in the solder layer.

Figure 3:
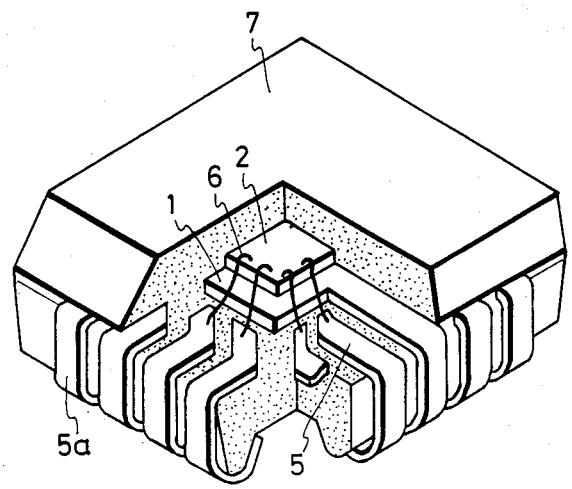
FIG. 3 is a cutaway perspective view showing a PLCC-type semiconductor device according to another embodiment of the present invention.

FIG. 3 shows a semiconductor device of the PLCC (plastic leaded chip carrier) type according to another embodiment of the present invention.

Figure 4:
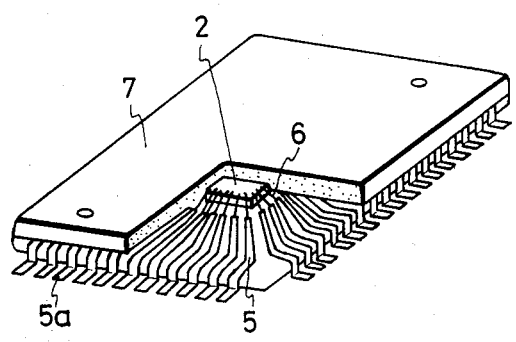
FIG. 4 is a cutaway perspective view showing an FPP-type semiconductor device according to a further embodiment of the present invention.

FIG. 4 shows a semiconductor device of the FPP (flat plastic package) type according to a further embodiment of the present invention.

With the PLCC-type and FPP-type semiconductor devices, the external leads are bent at many portions, and the sealing resin is brought into contact with the lead frame over limited areas. Therefore, application of the technical idea of the present invention makes it possible to obtain a highly reliable device that exhibits excellent resistance to heat and humidity.

Embodiment 2:

A semiconductor device of the embodiment 2 of the invention is nearly the same as the resin sealed-type semiconductor device of the embodiment 1 except the second layer. According to the embodiment 2, the second layer is composed of copper alloy which contains 0.05 to 0.2% by weight of zinc. It would found that the addition of a small amount of zinc to the second layer effectively suppresses the formation of the intermetallic compound. However, addition of zinc in large amounts as with brass has an adverse effect. It would found through experiments that the copper alloy should contain zinc in an amount of 0.05 to 0.2% by weight.

By forming the second layer as described above, there are obtained the effects that are nearly the same as those of the aforementioned embodiment 1.

As will be obvious from the aforementioned embodiments, the present invention provides effects as described below.

(1) The lead frame consisting of a copper base member is coated with a tin-nickel alloy layer or an iron-nickel alloy layer. Then, a pellet is bonded, wires are bonded, and a resin is applied thereto to form a package. Thereafter, a copper layer is formed as a second layer on the first layer which consists of the above nickel alloy layer on the external lead portions, and a solder layer is further formed as a third layer thereon. With the thus constructed device, no brittle intermetallic compound is formed in the coated layers even after the high-temperature and high-humidity testing and the aging treatment, and the coated layers do not crack or peel.

(2) Because of reason (1) above, solderability of the external lead portions is prevented from decreasing when the semiconductor device is mounted on a printed wiring board.

(3) Because of reason (1) above, the external lead portions exhibit increased resistance against heat and humidity.

(4) The effects same as those of (1) mentioned above can be obtained by forming the second layer of an alloy consisting of copper and 0.05 to 0.2% by weight of zinc.

(5) In a semiconductor device formed as mentioned in (1) above, the tab or the lead frame is adhered to the package resin via the tin-nickel alloy layer or the iron-nickel alloy layer. Therefore, high adhesive strength is maintained and the package exhibits increased resistance against the humidity.

In the foregoing was concretely described the invention accomplished by the inventors by way of embodiments. The invention, however, is in no way limited to the above-mentioned embodiments only but can be modified in a variety of other ways without departing from the spirit and scope of the invention.

In the embodiments, for instance, the first layer is formed using an alloy consisting of tin and nickel. The same effects, however, are obtained as a matter of course even when an alloy consisting of iron and nickel is used.

When the first layer is to be formed, furthermore, copper may be flash-plated on the surface of the copper base member of the lead frame, and the first layer composed of a tin-nickel alloy or an iron-nickel alloy may be deposited thereon, as a matter of course. This helps further increase the adhesion between the base member composed of copper and the first alloy layer.

The foregoing description has chiefly dealt with the case where the invention accomplished by the inventors was adapted to a semiconductor device of the so-called DIP-type among the resin sealed-type semiconductor devices in the field of applications that served as the background of the invention. The invention, however, should in no way be limited thereto only but can also be effectively adapted to any resin sealed-type semiconductor devices of the so-called flat package type.

What is claimed is:

1. In a semiconductor device comprising a pellet in which is formed a semiconductor integrated circuit with semiconductor elements as main elements, a plurality of leads that are electrically connected to a plurality of bonding pads of said pellet via fine metal wires, and a resinous sealing body which seals said pellet, said fine metal wires, and portions of said plurality of leads to which said fine metal wires are connected, the improvement wherein a base member of each of said leads is a copper alloy consisting chiefly of copper, an alloy layer consisting of nickel and tin or iron is formed on the whole surface of the base member of each of said leads, a metal plated layer consisting chiefly of copper is formed on portions of the leads exposed from said resinous sealing body, and a solder layer is formed on surfaces of the metal plated layer on the leads exposed from said resinous sealing body.

2. A semiconductor device according to claim 1, wherein a base member of each of the leads is a copper alloy which consists chiefly of copper, and an alloy layer consisting of tin and nickel is formed on the surface of the base member.

3. A semiconductor device according to claim 1, wherein a base member of each of the leads is a copper alloy which consists chiefly of copper, and an alloy layer consisting of iron and nickel is formed on the surface of the base member.

4. A semiconductor device according to claim 1, wherein the metal plated layer consisting chiefly of copper is a copper plated layer which consists of copper and impurities that are inevitably introduced.

5. A semiconductor device according to claim 1, wherein the metal plated layer consisting chiefly of copper is an alloy plated layer of zinc and copper, which contains 0.05 to 0.2% by weight of zinc, and the balance being copper and impurities that are inevitably introduced.

6. A semiconductor device according to claim 1, wherein the semiconductor device is of the PLCC (plastic leaded chip carrier) type.

7. A semiconductor device according to claim 1, wherein the semiconductor device is of the FPP (flat plastic package) type.

8. A method of manufacturing semiconductor devices comprising: a step for bonding a pellet in which is formed a semiconductor integrated circuit with semiconductor elements as main elements, onto a lead frame made of a base member of copper alloy that consists chiefly of copper, the entire surface of said base member being covered with an alloy layer consisting of nickel and tin or iron; a step for bonding the bonding pads of said pellet to corresponding portions of said lead frame via fine metal wires; a step for forming a resinous sealing body by sealing the pellet and peripheries thereof with a resin; a step for forming a copper layer or a copper alloy layer containing 0.05 to 0.2% by weight of zinc on surfaces of the lead frame that are exposed from the resinous sealing body; and a step for forming a solder layer on said copper layer or on said copper alloy layer.

9. A method of manufacturing a semiconductor device according to claim 8, wherein said copper layer is formed by plating with copper that consists of copper and impurities which are inevitably introduced.

10. A method of manufacturing a semiconductor device according to claim 8, wherein said copper alloy layer consisting chiefly of copper is formed by plating an alloy of zinc and copper, which contains 0.05 to 0.2% by weight of zinc, and the balance being copper and impurities that are inevitably introduced.

11. In a semiconductor device comprising a pellet in which a semiconductor integrated circuit with semiconductor elements as main elements is formed, a plurality of leads that are electrically connected to a plurality of bonding pads of said pellet via fine metal wires, and a resinous sealing body which seals said pellet, said fine metal wires, and portions of said plurality of leads to which said fine metal wires are connected, the improvement wherein a base member of each of said leads is a copper alloy consisting chiefly of copper, an alloy layer composed of a tin-nickel alloy layer or iron-nickel alloy layer is formed on the substantially whole surface of the base member of each of said leads, a metal plated layer consisting chiefly of copper is formed on portions of the leads exposed from said resinous sealing body, and a solder layer is formed on surfaces of the metal plated layer on the leads exposed from said resinous sealing body.

12. A semiconductor device according to claim 11, wherein the metal plated layer consisting chiefly of copper is a copper plated layer which consists of copper and impurities that are inevitably introduced.

13. A semiconductor device according to claim 11, wherein the metal plated layer consisting chiefly of copper is an allow plated layer of zinc and copper, which contains 0.05 to 0.2% by weight of zinc, and the balance being copper and impurities that are inevitably introduced.

14. A semiconductor device according to claim 11, wherein the semiconductor device is of the PLCC (plastic leaded chip carrier) type.

15. A semiconductor device according to claim 11, wherein the semiconductor device is of the FPP (flat plastic package) type.

* * * * *